United States Patent
Koito et al.

(10) Patent No.: US 6,869,921 B2
(45) Date of Patent: Mar. 22, 2005

(54) STRIPPING COMPOSITION

(75) Inventors: Tatsuya Koito, Minato-ku (JP); Keiji Hirano, Minato-ku (JP); Masayuki Takashima, Sodegaura (JP); Kenichi Tokioka, Minato-ku (JP); Hidemitsu Aoki, Minato-ku (JP)

(73) Assignees: NEC Electronics Corporation, Kanagawa (JP); Sumitomo Chemical Company, Limited, Osaka (JP)

( * ) Notice: Subject to any disclaimer, the term of this patent is extended or adjusted under 35 U.S.C. 154(b) by 236 days.

(21) Appl. No.: 10/208,796

(22) Filed: Aug. 1, 2002

(65) Prior Publication Data

US 2003/0130147 A1 Jul. 10, 2003

(30) Foreign Application Priority Data

Aug. 3, 2001 (JP) ........................................ 2001-236627

(51) Int. Cl.⁷ ............................. C11D 7/26; C11D 7/32; C11D 7/50

(52) U.S. Cl. ....................... 510/176; 510/175; 510/206; 510/212; 510/505; 134/3

(58) Field of Search ............................ 510/175, 176, 510/206, 212, 505, 177; 134/3

(56) References Cited

U.S. PATENT DOCUMENTS

| 5,795,702 A | * | 8/1998 | Tanabe et al. | 430/331 |
| 5,962,383 A | * | 10/1999 | Doyel et al. | 510/164 |
| 6,677,286 B1 | * | 1/2004 | Rovito et al. | 510/175 |

FOREIGN PATENT DOCUMENTS

| EP | 0 773 480 A1 | 5/1997 |
| EP | 1 091 254 A2 | 4/2001 |

\* cited by examiner

*Primary Examiner*—Gregory Webb
(74) *Attorney, Agent, or Firm*—Sughrue Mion, PLLC (57) ABSTRACT

A stripping composition comprising at least one of alcohols having an ether-bond in the molecule thereof as component (a), and an anticorrosive as component (b). Furfuryl alcohol or tetrahydrofurfuryl alcohol is preferable as component (a).

44 Claims, 2 Drawing Sheets

STRIPPING COMPOSITION

BACKGROUND OF THE INVENTION

1. Field of the Invention

The present invention relates to a stripping composition for removing unnecessary substances in a semiconductor device, such as a resist left after etching and an etching residue.

2. Description of the Related Art

In a step for forming holes or wiring trenches or the like in the process for manufacturing a semiconductor device, a resist pattern is formed using lithography, dry etching is performed using the resist pattern as a mask, and the resist pattern as the mask is removed. In order to remove the resist pattern, a wet processing using a stripping solution after ashing with plasma or the like is generally performed. Heretofore, various stripping solutions have been developed and practically used, and for example, organic sulfonic acid-based stripping solutions containing an alkyl benzene-sulfonic acid as the main component, organic amine-based stripping solution containing an amine such as monoethanol amine as the main component, or hydrofluoric acid-based stripping solutions containing hydrofluoric acid or a salt thereof as the main component have been known.

However, to meet recent demands for increasing the speed of semiconductor devices, as well as improving stripping properties from further integration and densification of semiconductor devices, low-resistance materials, such as copper, have been used more frequently as a wiring material. When via holes or the like are formed in interlayer insulating films on copper wiring, if etching residues, particularly of silicon and the oxides thereof, produced during the etching of the interlayer insulating films remain on the bottoms and sidewalls of the via holes, these etching residues interfere with the formation of films, such as barrier films formed in the following step; therefore, etching residues must be removed. However, if conventionally known stripping solutions are used for removing etching residues, a critical problem of the dissolution of copper wirings exposed on the bottoms of via holes arises. Therefore, from the viewpoint of preventing the corrosion of metal materials, such as copper wirings, by the stripping solution, compositions of stripping solutions containing anticorrosive substances have been proposed.

On the other hand, in order to utilize the feature of low resistance of copper wirings, it is required to lower the capacity between adjacent wirings, and materials having a low dielectric constant are generally used for interlayer insulating films formed around the wirings. These materials include, for example, inorganic materials, such as SiOC (carbon-containing $SiO_2$); polyorganosiloxanes, such as MSQ (methyl silsesquioxane), HSQ (hydrogen silsesquioxane), and MHSQ (methylated hydrogen silsesquioxane); and aromatic organic materials, such a polyaryl ether (PAE) and divinyl siloxane-bis-benzocyclobutene (BCB). These low-dielectric materials have a problem of poor ashing resistance, and the dielectric constant increases when exposed to plasma. Therefore, it is desired to make ashing time as short as possible, and to make ashing conditions as moderate as possible; however, in this case, the treatment using a stripping solution having a strong strippability is essential.

As photoresist stripping solutions, and solutions for removing degenerated film after ashing, especially for removing residues of silicon and the oxides thereof, compositions containing fluorine compounds, such as hydrofluoric acid, are frequently used. The known examples include, for example, a semiconductor device cleaning agent containing a specific quaternary ammonium salt, a fluorine compound, and an organic solvent (Japanese Patent Application Laid-Open No. 7-201794); a resist stripping composition containing the salt of a base containing no metal ions and hydrofluoric acid, and a water-soluble organic solvent, of a pH of 5 to 8 (Japanese Patent Application Laid-Open No. 9-197681); a semiconductor device cleaning agent containing specific quantities of a fluorine compound, a water-soluble organic solvent, and water (Japanese Patent Application Laid-Open No. 11-67632); and a stripping solution containing a specific proportions of a specific quaternary ammonium hydroxide, a nucleophillic amine compound having an oxidation-reduction potential, sugars and/or sugar alcohols, and water (Japanese Patent Application Laid-Open No. 9-283507).

As stripping compositions imparted with an anticorrosive function of metal wirings, U.S. Pat. No. 5,417,877 discloses a stripping composition containing an amide and an amine as major components, whereto a component having a 5- or 6-member cyclic structure in the molecule thereof, and having a plurality of hetero atoms to coordinate to the wiring material metal and to form a 5- or 6-member cyclic coordinate complex; and Japanese Patent Application Laid-Open No. 10-171130 discloses a stripping composition containing an organic amine and a nitrogen-containing compound having a specific structure. However, no applications to fine and multi-layered wiring processes adopting copper wirings and low-dielectric films are considered in these patents, and even if the corrosion resistance of metal wirings is achieved, there are problems of incomplete removal of deposits on the surface of a substrate, and the occurrence of damage of the low-dielectric films.

Consequently, in conventional stripping solutions and cleaning solutions according to these patents, the low-dielectric films are not considered, and cannot prevent the corrosion of metal wirings formed on recent substrates of high integration and high densification.

Furthermore, stripping solutions and cleaning solutions containing fluorine compounds such as hydrofluoric acid have problems of easily corroding copper films and easily damaging the film quality of the materials of low-dielectric films.

The present inventors also found that even if the amine content was increased to improve the removal of unnecessary residues, such as deposits on the bottoms and sidewalls of via holes, there was a problem of increase in damage to the film quality of the materials of low-dielectric films.

As described above, if a method excels in removal of residues on the bottoms and sidewalls of via holes, there are problems of increase in corrosion of metal wirings and damage to the materials of low-dielectric films.

In order to solve these problems in prior art, the present inventors invented a stripping composition comprising a stripping agent, specifically an alkanolamine, a solvent, and an anticorrosive, wherein the anticorrosive was purine, a purine derivative, uric acid, or a uric acid derivative, and previously filed the application for patent (Japanese Patent Application No. 2001-196512). However, even if the stripping composition according to the prior invention was used, there was found the case where damage occurs or the removal of the deposits on the surface of the substrate was incomplete depending on the type of low-dielectric films.

Heretofore, although a resist stripping solution has been developed as a means for improving the corrosion resistance of wiring materials, in the situation where a low-dielectric film is used as an interlayer insulating film, the necessity to strip residues after ashing and resist residues in the state where the low-dielectric film is exposed during the stripping step has arisen. Therefore, the study of stripping solutions from a different point of view from the prior art is required.

SUMMARY OF THE INVENTION

The present invention is devised considering the above-described situations, and the object of the present invention is to provide a stripping composition that excels in the ability of removing residues produced by the formation of via holes by the etching of interlayer insulating films on the metal films, particularly on recent highly integrated substrates, followed by the ashing of remaining resist; that excels in an ability of removing a residue of which silicon and oxide thereof are main component; that excels the ability for preventing the corrosion of metal films; and that lowers the damage to the film quality of interlayer insulating films, particularly low-dielectric films, to a practical level.

In order to solve such problems, the present inventors had studied in detail the components that constitute stripping solutions by functions. First, since the anticorrosive component exerts anticorrosive functions by adsorbing on the surface of wiring metals by coordinate linkage, and keeping corrosive ions away from the surface of the metal, the anticorrosive does not function effectively if the solubility of the anticorrosive in a solvent is too large. Therefore, the selection of solvents is critical for allowing the anticorrosive to function effectively. Furthermore, the selection of solvents that do not damage low-dielectric films is critical. Particularly, the inventors found desired that the permeability of the solvent into low-dielectric films is low. In addition, the addition of hydrofluoric acid (HF) is effective for the removal (stripping) of $SiO_2$-based deposits on the surfaces of substrates, and amines, especially alkanolamines are effective for the removal (stripping) of resist residues. However, it was found that if the components to elevate stripping functions were excessively added, and the pH of the stripping composition was 6 or below, or 12 or above, a certain type of low-dielectric films were damaged. The desired liquid was weakly alkaline, and when a component having an ability to buffer pH, i.e., a weak acid, preferably an organic acid, and more preferably lactic acid was added to the stripping composition, liquid control to weakly alkaline was improved, and stable strippability was achieved.

As a result of detailed studies, the inventors found the stripping composition that could simultaneously achieve high-degree residue removing performance, high-degree anticorrosive performance, and low damage to low-dielectric films; and eventually completed the present invention.

According to the present invention, there are provided:
(I) A stripping composition comprising at least one of alcohols having an ether-bond in the molecule thereof as component (a), and an anticorrosive as component (b).
(II) The stripping composition according to (I), wherein the component (a) is an alcohol having a cyclic ether structure in the molecule thereof.
(III) The stripping composition according to (II), wherein the alcohol having a cyclic ether structure in the molecule thereof is represented by the following chemical formula:

X—(A—OH)$_n$ where X is a cyclic ether structure, A is a hydrocarbon chain having 1 to 8 carbon atoms, and n 1 or more that represents the number of substituents to the cyclic ether structure.

(IV) The stripping composition according to (II) or (III), wherein the alcohol having a cyclic ether structure in the molecule thereof is furfuryl alcohol or tetrahydrofurfuryl alcohol.
(V) The stripping composition according to (I), wherein the component (a) is a mixture of alcohol having a cyclic ether structure in the molecule thereof and alcohol having a glycol ether structure in the molecule thereof.
(VI) The stripping composition according to any of (I) to (V), comprising at least one of organic or inorganic weak acids as component (c).
(VII) The stripping composition according to (VI), wherein the component (c) is lactic acid.
(VIII) The stripping composition according to any of (I) to (VII), comprising water as component (d).
(IX) The stripping composition according to (VIII), wherein the content of the water is less than 70% by weight.
(X) The stripping composition according to any of (I) to (IX), wherein the component (b) is an anticorrosive selected from the group consisting of (1) purine derivatives; (2) compounds of dibasicity or higher, each having at least one carboxylic group, having an ability to form a chelate with a metal, and having a hydrophobic group; (3) the mixture of the purine derivatives and quinaldinic acid, or (4) the mixture of the compounds of (2) and quinaldinic acid; (5) the mixture of the purine derivatives of (1) and the compounds of (2); and (6) the mixture of the purine derivatives of (1), the compounds of (2), and quinaldinic acid.
(XI) The stripping composition according to (X), wherein the compound of (2) is o-phthalic acid.
(XII) The stripping composition according to (X), wherein the purine derivative of (1) is adenine or the derivative thereof.
(XIII) The stripping composition according to any of (I) to (XII), further comprising at least one of amines as component (e).
(XIV) The stripping composition according to (XIII), wherein the amine is an alkanolamine.
(XV) The stripping composition according to (XIII), wherein the base equivalent value of the amines is larger than the equivalent value of the acid component in the system.
(XVI) The stripping composition according to any of (XIII) to (XV), comprising 0.001 to 15% by weight of component (b), 0 to 15% by weight of component (c), 2% by weight or more and less than 70% by weight of component (d), 1 to 40% by weight of component (e), and 30% by weight or more component (a) as the balance.
(XVII) A stripping composition comprising at least one of alcohols having an ether bond in the molecule thereof as component (a), at least one of hydrofluoric acid and a salt thereof as component (c'), and water as component (d).
(XVIII) The stripping composition according to (XVII), wherein the component (a) is an alcohol having a cyclic ether structure in the molecule thereof.
(XIX) The stripping composition according to (XVIII), wherein the alcohol having a cyclic ether structure in the molecule thereof is furfuryl alcohol or tetrahydrofurfuryl alcohol.
(XX) The stripping composition according to any of (XVII) to (XIX), further comprising at least one of amines as component (e).
(XXI) The stripping composition according to (XX), wherein the amine is an alkanolamine.
(XXII) The stripping composition according to (XX) or (XXI), comprising 0.01 to 15% by weight of component (c'), 5 to 30% by weight of component (d), 10 to 40% by weight of component (e), and 20% by weight or more component (a) as the balance.

(XXIII) The stripping composition according to any of (XVII) to (XXII), further comprising an anticorrosive as component (b).

(XXIV) The stripping composition according to (XXIII), wherein the component (b) is an anticorrosive selected from the group consisting of (1) purine derivatives; (2) compounds of dibasicity of higher, each having at least one carboxylic group, having an ability to form a chelate with a metal, and having a hydrophobic group; (3) the mixture of the purine derivatives and quinaldinic acid, or (4) the mixture of the compounds of (2) and quinaldinic acid; (5) the mixture of the purine derivatives of (1) and the compounds of (2); and (6) the mixture of the purine derivatives of (1), the compounds of (2), and quinaldinic acid.

(XXV) The stripping composition according to (XXIV), wherein the compound of (2) is o-phthalic acid.

(XXVI) The stripping composition according to (XXIV), wherein the purine derivative of (1) is adenine or a derivative thereof.

(XXVII) The stripping composition according to any of (XXIII) to (XXVI), comprising 0.001 to 15% by weight of component (b).

According to the present invention, a stripping composition that excels in the ability to remove unnecessary substances such as etching residues can be provided. In particular, an excellent stripping composition that caused little damage on low-dielectric films can be provided.

Especially according to the stripping composition of the present invention, sufficient anticorrosive ability can be achieved even if the content of expensive anticorrosive components is extremely decreased.

DESCRIPTION OF SYMBOLS

1: Silicon oxide film
2: Silicon nitride film (SiN (SiCN))
3: Silicon oxide film ($SiO_2$ (Low-K))
4: Barrier metal film
5: Copper film
6: Silicon nitride film (SiN (SiCN))
7: Low-dielectric film
8: Silicon oxide film
9: Resist film
10: Via hole
11: Etching residue
12: Etching residue
13: Barrier metal film
14: Tungsten film

DETAILED DESCRIPTION OF THE PREFERRED EMBODIMENTS

The present invention will be described in detail below.

The first stripping composition of the present invention is a stripping composition comprising at least one of alcohols having an ether-bond in the molecule thereof as component (a), and an anticorrosive as component (b).

Although alcohols of component (a) are not limited to specific alcohols as long as the alcohols are miscible with water, each of these alcohols is characterized to have an ether bond in the molecule thereof. These compounds include glycol ethers, such as ethylene glycol monomethyl ether, diethylene glycol monomethyl ether, triethylene glycol monomethyl ether, ethylene glycol monoethyl ether, diethylene glycol monoethyl ether, triethylene glycol monoethyl ether, ethylene glycol mono-iso-propyl ether, diethylene glycol mono-iso-propyl ether, triethylene glycol mono-iso-propyl ether, ethylene glycol monobutyl ether, diethylene glycol monobutyl ether, triethylene glycol monobutyl ether, ethylene glycol mono-iso-butyl ether, and diethylene glycol mono-iso-butyl ether; alcohols having a cyclic alkoxy group, for example, alicyclic oxy group, such as cyclobutoxy, cyclopentoxy, and cyclohexyloxy groups; alcohols having a heterocyclic oxy group containing nitrogen or sulfur as the hetero atom; and alcohols having a cyclic ether structure containing at least oxygen as the hetero atom. Preferable among these compounds are alcohols having a cyclic ether structure. Alcohols having a cyclic ether structure are preferably represented by the following formula:

(where X is a cyclic ether structure, A is a hydrocarbon chain having 1 to 8 carbon atoms, and n is an integer of 1 or more and represents the number of substituents to the cyclic ether structure).

In the above chemical formula, hydrocarbon chains having 1 to 8 carbon atoms include straight, branched, or cyclic alkylene groups having 1 to 8 carbon atoms, straight, branched, or cyclic alkenylene groups having 2 to 8 carbon atoms, and straight or branched alkynylene groups having 2 to 8 carbon atoms; preferably straight-chain alkylene groups having 1 to 8 carbon atoms, and more preferably a methylene group. X is a cyclic ether structure having a ring of three members or more, and preferably a five- or six-member cyclic structure. The cyclic ether structure represented by X may contain a nitrogen atom or a sulfur atom intervened a carbon atom between such a hetero atom and an oxygen atom. The cyclic ether structure may be polycyclic structure. The examples include a structure derived from a heterocyclic compound containing nitrogen or sulfur atoms other than oxygen atoms as hetero atoms, such as morpholine; or polycyclic compounds, such as thienofuran.

Specifically, alcohols having the following five-member cyclic ether structure:

-continued (a3)

(In chemical formulas (a1) to (a3), each of $A_1$ to $A_{12}$ is independently selected from H, OH, a halogen, amino, cyano, nitro, SH, $SO_3H$, COOH, alkyl having 1 to 8 carbon atoms, and —A—OH (A has the same meaning as above), $COOCH_3$, $COOC_2H_5$, $CH_3$, $CH_2NH_2$, $CONH_2$, $NHCH_3$, $N(CH_3)_2$, $NHCH_2CH_3$, $N(CH_2CH_3)COCH_3$, $N(CH_3)COCH_3$, $COCH_3$, $CON(CH_2CH_3)_2$, $CH_2OCH_3$, $CH_2Cl$, $OCH_3$, CHO, $OCH_2CH_3$, $SCOCH_3$, $O(CH_2)_4Cl$, $CH_2SH$, COCl, $COCH_2COCF_3$, CH=CHCHO, CH=CHCOOH, $CH=CH_2$, $C(OH)(CH_3)_2$, $=CH_2$, $CH=NNHCONH_2$, $OCH_2CH_2NH_2$, and $OCH_2CH_2NO_2$; and at least one substituent of chemical formulas (a1) to (a3) is a substituent represented by —A—OH.) and alcohols having the following six-member cyclic ether structure:

(b1)

(b2)

(b3)

(b4)

(b5)

(b6)

(In chemical formulas (b1) to (b6), each of $B_1$ to $B_{27}$ is independently selected from H, OH, a halogen, amino, nitro, cyano, SH, $SO_3H$, COOH, alkyl having 1 to 8 carbon atoms, and —A—OH (A has the same meaning as above), $COOCH_3$, $COOC_2H_5$, $CH_2NH_2$, $CONH_2$, $NHCH_3$, $N(CH_3)_2$, $NHCH_2CH_3$, $N(CH_2CH_3)COCH_3$, $N(CH_3)COCH_3$, $COCH_3$, $CON(CH_2CH_3)_2$, $CH_2OCH_3$, $CH_2Cl$, $OCH_3$, CHO, $OCH_2CH_3$, $SCOCH_3$, $O(CH_2)_4Cl$, $CH_2SH$, COCl, $COCH_2COCF_3$, CH=CHCHO, CH=CHCOOH, $CH=CH_2$, $C(OH)(CH_3)_2$, $=CH_2$, $CH=NNHCONH_2$, $OCH_2CH_2NH_2$, and $OCH_2CH_2NO_2$; and at least one substituent of chemical formulas (b1) to (b6) is a substituent represented by —A—OH.) are mentioned.

A solvent wherein a bulky cyclic ether structure and an alcoholic hydroxyl group are bonded to a hydrocarbon chain, that is, at least one substituent in the above chemical formulas (a1) to (a3) and (b1) to (b6) is —A—OH, is preferable. In particular, in view of the balance between the ability to dissolve other components constituting the stripping composition, the ability to strip deposits on the wafer surfaces, and permeability to low-dielectric films, furfuryl alcohol (FFA) and tetrahydrofurfuryl alcohol (THFA) are preferable. As these solvents, alcohol having cyclic structure can be used alone, but can be mixed with alcohols having a glycol ether structure within a range where damage of the low-dielectric film is small. For example, the mixture of tetrahydrofurfuryl alcohol (THFA) as an alcohol having a cyclic ether structure, and diethylene glycol monobutyl ether or the like as an alcohol having a glycol ether structure can be used. The mixing ratio of the alcohol having a cyclic ether structure in the mixed solvent is preferably 10% by weight or more, more preferably 30% by weight or more when the total quantity of solvents in the stripping composition is 100% by weight.

Although a resist stripping solution containing furfuryl alcohol is disclosed in Japanese Patent Application Laid-Open No. 9-22122, it is not used by combining an anticorrosive as in the present invention, and is not used as a second hydrofluoric acid-based stripping solution of the present invention, which will be described later, and in the embodiments thereof, no embodiments using furfuryl alcohol are described. Especially, small damage to low-dielectric films is not described or suggested.

As the anticorrosive of the component (b) in the stripping composition of the present invention, a conventionally known anticorrosive can be used. The examples include aromatic hydroxyl compounds, acetylenic alcohol, carboxyl-group-containing organic compounds, and heterocyclic compounds, such as triazole-based compounds and purine-based compounds. Particularly in the present invention, preferable anticorrosives are selected from the group consisting of (1) purine derivatives; (2) dibasic or higher compounds having an ability to form a chelate with a metal, and having at least one carboxyl group and a hydrophobic group; (3) mixtures of the purine derivatives and quinaldinic acid, or (4) mixtures of the compounds of (2) and quinaldinic acid; (5) mixtures of the purine derivatives of (1) and the compounds of (2); and (6) mixtures of the purine derivatives of (1), the compounds of (2), and quinaldinic acid.

Here, as the purine derivatives of (1), adenine, represented by the following general formula (1) and the derivatives thereof are preferable.

(1)

(In the formula (1), each of $R^1$ and $R^2$ independently represents a hydrogen atom, a hydroxyl group, or an alkyl group having 1 to 5 carbon atoms or an amino group.)

The compound of (2) are dibasic or higher compounds having a hydrophobic group and at least one carboxyl group, and having an ability to form a chelate with a metal, especially copper, and have the structure represented in the following general formula (2):

(2)

(In the formula (2), A represents a hydrophobic group; $R^3$ represents a hydroxyl group, a carboxyl group, an amino group, or the like; n represents an integer of 1 or more, preferably an integer from 1 to 3.)

Especially, the compounds of (2) form a chelate with a metal immediately upon contacting to the surface of the metal, and form a uniform film on the surface thereof because hydrophobic groups are arranged outside, exerting the effect to inhibit the oxidation of the metal surface. As the compounds of (2), phthalic acid, particularly o-phthalic acid is preferable.

Although the first stripping composition of the present invention contains the above described component (a) and component (b) as essential components, the composition may contain a weak organic or inorganic acid as component (c), water as component (d), and amines as component (e).

A weak acid of component (c) is a weak inorganic or organic acid. Examples of organic acids include, for example, monocarboxylic acids such as formic acid, acetic acid, and propionic acid; dicarboxylic acids such as oxalic acid, malonic acid, succinic acid, glutanic acid, adipic acid, pimelic acid, maleic acid, and fumaric acid; tricarboxylic acids such as trimellitic acid and tricarballylic acid; and oxycaroxylic acids such as hydroxyacetic acid, lactic acid, salicylic acid, malic acid, tartaric acid, citric acid, gluconic acid, 2-deoxy-gluconic acid, and mucic acid. Preferable of these are oxycarboxylic acids such as citric acid, gluconic acid and lactic acid, and most preferable is lactic acid.

Water of component (d) may be added separately, but may be water accompanying the above-described component. The content of water is preferably less than 70%.

Amines of component (e) include quaternary ammonium salts, such as tetramethylammonium hydroxide (TMAH) and choline (($CH_3)_3N^+CH_2CH_2OH$); hydroxylamine; and alkanolamines. Examples of alkanolamines include specifically monoethanolamine, diethanolamine, 2-(ethylamino)-ethanol, 2-(methylamino)-ethanol, N-methyldiethanolamine, dimethylaminoethanol, 2-(2-aminoethoxy)-ethanol, 1-amino-2-propanol, triethanolamine, monopropanolamine, and dibutanolamine. Particularly preferable of these are monoethanolamine and 2-(methylamino)-ethanol.

Since alkanolamines such as monoethanolamine and 2-(ethylamino)-ethanol have preferable biodegradability, when these are selected as a component of the stripping composition, the safety and biodegradability of the stripping composition of the present invention can be enhanced.

When the first stripping composition of the present invention is used, treatment can be performed at room temperature (low temperature) without heating, or the composition may be heated to about 50 to 100° C. Although sufficient anticorrosion cannot be achieved under a low-temperature condition depending on the anticorrosive of component (b), under such a low-temperature condition, excellent anticorrosive properties and residue removing ability can be compatible by using the mixture of the above-described compounds (1) and (2), or the mixture of these compounds or mixture and quinaldinic acid.

The first stripping composition contains 0.001 to 15% by weight of the component (b), 0 to 15% by weight of the component (c), 2% by weight or more and less than 70% by weight of the component (d), 1 to 40% by weight of the component (d), and 30% by weight or more of the component (a) as the balance, to make 100% by weight in total. If the content of the component (a) is less than 30% by weight, strippability may become insufficient, and if it exceeds 90% by weight, the residue strippability may lower, anticorrosive properties may also lower, and damage of low-dielectric films may increase. If the content of water of the component (d) is less than 2% by weight, the residue strippability may also lower; therefore, the water content is preferably 2% by weight or more, more preferably 5% by weight or more. If the content of water of the component (d) is 70% by weight or more, the content of the component (a) of 30% by weight cannot be secured, and the residue strippability will lower as described above.

It is desirable that the first stripping composition of the present invention is prepared so that the pH becomes 6 to 12 during the use of the composition. Preferably, the composition is prepared so that the base equivalent weight of amines of the component (e) becomes larger than the acid equivalent weight in the system, so that the composition becomes neutral (pH 7) to weakly basic (pH 10). Furthermore, other components can be mixed to the stripping composition of the present invention within a range not to degrade the performance. For example, an aminocarboxylic acid-based or phosphonic acid-based chelating agent; or an anionic, cationic, or nonionic surface active agent can be added.

The second stripping composition of the present invention is a hydrofluoric acid-based composition, and is particularly effective for removing silicon oxide-based residues.

The second stripping composition of the present invention is characterized by comprising at least one of alcohols having an ether-bond in the molecule thereof as the component (a), at least one of hydrofluoric acid and the salts thereof as the component (c'), and water as the component (d).

Here, alcohols having an ether bond in the molecule thereof of the component (a) are the same as the component (a) of the first stripping composition, preferably alcohols having a cyclic structure in the molecule thereof, and more preferably furfuryl alcohol or tetrafurufuryl alcohol Hydrofluoric acid and the salts thereof of the component (c') include hydrofluoric acid (HF), the ammonium salts thereof (e.g., ammonium fluoride and acidic ammonium fluoride), and the amine salts thereof (e.g., methylamine hydrofluoride, ethylamine hydrofluoride, and propylamine hydrofluoride). Salts containing ions that exert adverse effect to semiconductor elements, such as sodium salts and calcium salts are not preferable. When ammonium fluoride is used, it is preferable to remove ammonium ions from the system. Although ammonium ions can be removed by allowing the prepared stripping solution to stand at room temperature for a long period of time, they can also be removed by heating the solution. They are effectively removed in the presence of alkanolamines.

When the second stripping composition of the present invention is used, treatment may be performed at room temperature (low temperature) without heating, or may be heated to 50 to 100° C.

Furthermore, in the second stripping composition of the present invention, amines described in the first stripping composition may be added as the component (e), and anticorrosives described in the first stripping composition may be added as the component (b).

Although sufficient anticorrosion cannot be achieved under a low-temperature condition depending on the anticorrosive of component (b), under such a low-temperature condition, excellent anticorrosive properties and residue removing ability can be compatible by using the mixture of the above-described compounds (1) and (2), or the mixture of these compounds or mixture and quinaldinic acid.

The second stripping composition contains 0.01 to 15% by weight of the component (c'), 5 to 30% by weight of the component (d), 10 to 40% by weight of the component (e), and 20% by weight or more of the component (a) as the balance, to make 100% by weight in total. If the content of the component (a) is less than 20% by weight, strippability may become insufficient, and if it exceeds 90% by weight, the residue strippability may lower, anticorrosive properties may also lower, and damage of low-dielectric films may increase. Therefore, the content of the component (a) is preferably 20% by weight or more, more preferably from 50% by weight to 90% by weight. When the component (b) is contained, the content is preferably from 0.001 to 15% by weight. Furthermore, also in the second stripping composition of the present invention, other components can be mixed to the stripping composition of the present invention within a range not to degrade the performance. For example, an aminocarboxylic acid-based or phosphonic acid-based chelating agent; or an anionic, cationic, or nonionic surface active agent can be added.

The first and second stripping compositions of the present invention can be used for stripping various resists, and can be applied to KrF resists consisting of aromatic compounds, or ArF resists such as an alicyclic acrylic polymer. For example, they can be applied to (i) a positive resist containing a naphthoquinone diazide compound and a novolak resin; (ii) a positive resist containing a compound that generates an acid by exposure, a compound decomposed by acid and whose solubility in an aqueous alkali solution increases, and an alkali-soluble resin; (iii) a positive resist containing a compound that generates an acid by exposure, and an alkali-soluble resin decomposed by acid and whose solubility in an aqueous alkali solution increases; and (iv) a negative resist containing a compound that generates an acid by exposure, a cross-linking agent, and an alkali-soluble resin.

The stripping compositions of the present invention remove unnecessary substances on a semiconductor substrate. Unnecessary substances on a semiconductor substrate are various unnecessary substances produced during the process for manufacturing semiconductor devices, and include resist films, etching residues after dry etching, as well as chemically degraded resist films. They are particularly effective when the substance to be stripped is a resist film and/or an etching residue on a semiconductor substrate having a metal film exposed surface. Furthermore, when the above-described metal film is a copper film, the anticorrosive ability of the stripping compositions of the present invention is more effectively exerted.

Although the present invention is effective when applied to the removal of resist films and/or etching residues on a semiconductor wafer having an exposed surface of a metal film, it is especially effective when the metal film is made of copper or a copper alloy containing copper as the main component, and a low-dielectric film is used as an interlayer insulating film. The copper alloy containing copper as the main component means an alloy containing 90% by weight or more copper, and other elements such as Sn, Ag, Mg, Ni, Co, Ti, Si, and Al. Since these metals have low resistances, and improve the high-speed operation of elements, but are easily dissolved or corroded by chemicals, the effect of the application of the present invention becomes significant. Methods for forming the low-dielectric film are divided according to the difference in methods of film formation into the spin coating method, wherein a solution produced by previously dissolving the resin for forming the low-dielectric film in a solvent is applied onto a rotating semiconductor wafer to form a film, and is baked; and the CVD method wherein a monomer solution or the like is volatized by heating or bubbling, or a gaseous monomer at normal temperature is decomposed by plasma or heat energy, and recombined to form a thin film on the wafer. The films formed by the spin coating method include a polyorganosiloxane-bases thin film, such as MSQ (methyl silsesquioxane), HSQ (hydrogen silsesquioxane), and MHSQ (methylated hydrogen silsesquioxane); and aromatic organic thin film, such as PAE (polyaryl ether) and BCB (divinylsiloxane-bis-benzocyclobutene). The films formed by the CVD method include an FSG-based thin film, an SiON-based thin film, and an SiOC-based thin film. Although the stripping composition of the present invention does not depend on the methods for forming these low-dielectric films or the type of films, it is especially effective to organosiloxane-based thin films, aromatic organic thin films, and SiOC thin films.

Next, as an application example, the formation of an interconnection plug on a copper wiring by a single Damascene process will be described.

Figure 1A:
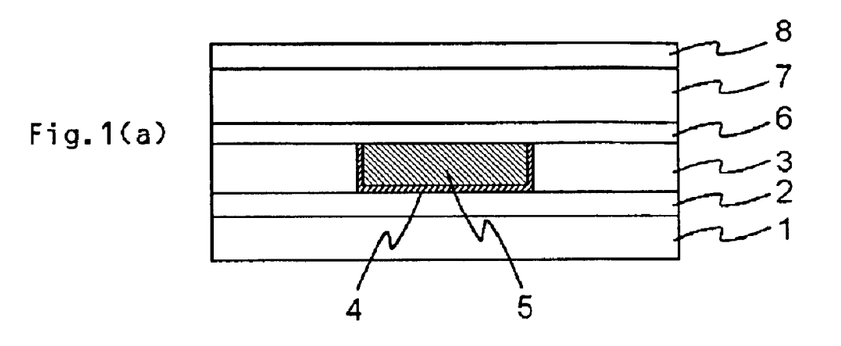
FIG. 1(a) to FIG. 1(c) show cross-sectional views of exemplary fabricating steps of a semiconductor device using a stripping composition according to this invention.

First, as shown in FIG. 1(a), after forming a silicon oxide film 1, a silicon nitride film 2, and a silicon oxide film 3 on a semiconductor substrate (not shown) whereon elements such as transistors are formed, a copper wiring consisting of a barrier metal 4 and a copper film 5 is formed using a known Damascene process utilizing chemical mechanical polishing (CMP), whereon a silicon nitride film 6 of a thickness of about 50 to 100 nm and a low-dielectric film 7 of MSQ or the like of a thickness of about 250 to 500 nm are formed, and then, a silicon oxide film 8 of a thickness of about 250 to 500 nm is formed. Although the thickness of the copper film 5 can be selected optionally, the thickness is preferably, for example, 350 nm or less from the viewpoint of lowering parasitic capacitance between wirings adjacent to each other. When the film thickness of the copper wiring is reduced, the thickness of the corrosive layer to the entire copper wiring layer increases relatively, and increase in wiring resistance due to the corrosion of the surface of copper causes a problem; however, the use of the stripping composition of the present invention solves such a problem, and enables the film thickness to reduce. Although the thickness of the silicon nitride film is about 50 to 100 nm, it may be made thicker to enhance the function as the etch-stop film.

Figure 1B:
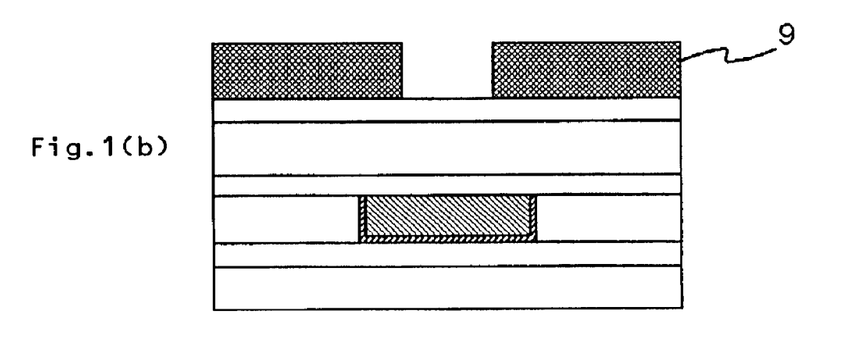

Next, a resist film 9 patterned to a predetermined shape is formed on the silicon oxide film 8 (FIG. 1(b)).

Figure 1C:
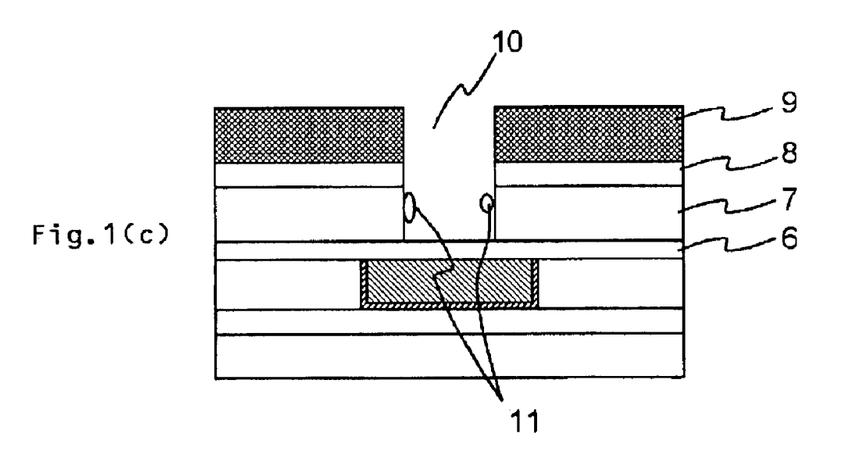

Then, the silicon oxide film 8 and the low-dielectric film 7 are subjected to dry etching using the resist film 9 as the mask until the silicon nitride film 6 is exposed to form a via hole 10 (FIG. 1(c)). In this time, etching residues 11 adhere on the inner wall of the via hole 10. The opening diameter of the via hole 10 is, for example, about 0.2 $\mu$m. As the etching gas, it is preferable to use a gas that etches the silicon oxide film faster than the silicon nitride film.

Figure 2A:
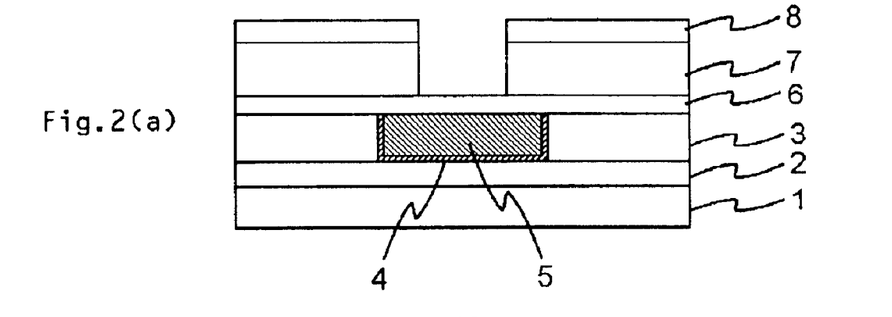
FIG. 2(a) to FIG. 2(d) show cross-sectional views of exemplary fabricating steps of a semiconductor device using a stripping composition according to this invention, following the steps shown in FIG. 1(c).

After the completion of etching, a part of the resist film 9 is removed by oxygen plasma ashing or $N_2$—$H_2$ gas plasma, and then, a stripping treatment is performed using the stripping composition of the present invention. By this stripping treatment, the resist films and etching residues 11 that have not been removed completely by ashing can be removed. As described above, after etching, the copper film 5 may be exposed in the via hole of a large opening area. In such a case, the stripping composition requires an anticorrosive ability to copper; however, the use of the stripping composition of the present invention enables the effective removal of the resist films and etching residues 11 without damaging the copper film 5. FIG. 2(*a*) shows the state after the completion of the stripping treatment.

Figure 2B:
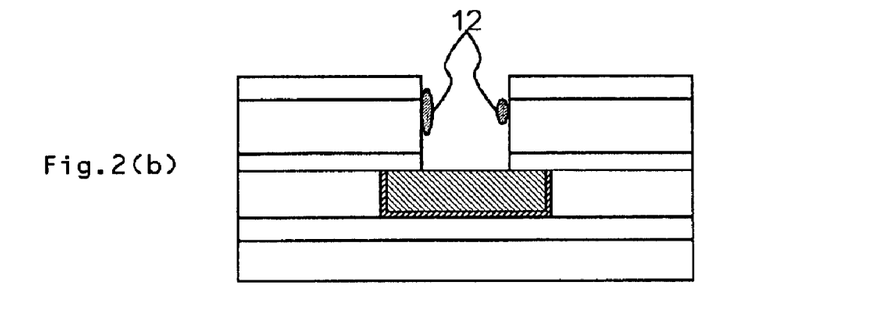
Figure 2C:
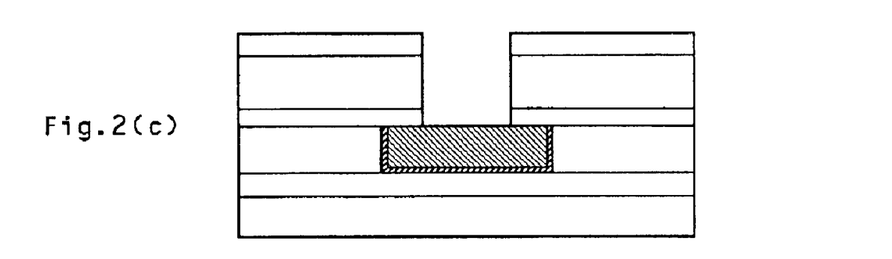
Figure 2D:
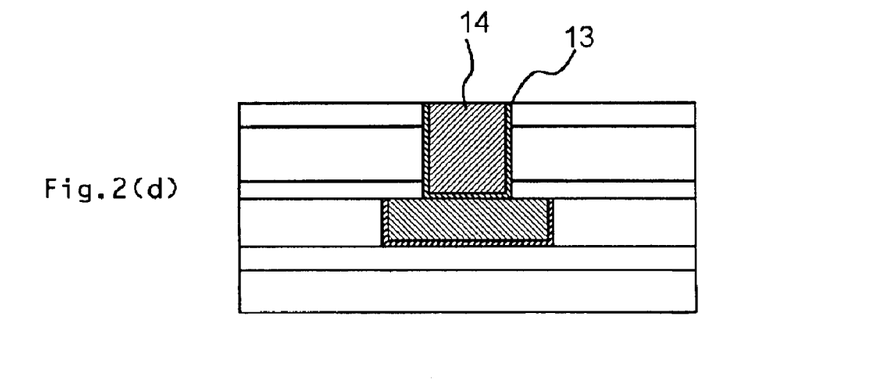

Thereafter, the etching gas is changed from the gas used in the above-described etching, and etching of the silicon nitride film 6 is performed. In this time, etching residues 12 adhere on the inner wall of the via hole 10 (FIG. 2(*b*)). In order to strip and remove the etching residues 12, the stripping treatment is performed again using the above-described stripping composition. In this stage of stripping treatment, although the copper film 5 is exposed on the bottom of the via hole 10, the use of the stripping composition of the present invention enables the removal of the etching residues 12 without damaging the copper film 5 (FIG. 2 (*c*)).

Thereafter, a barrier metal film 13 wherein Ti and TiN are laminate in this order, and a tungsten film 14 are formed inside the via hole, and then planarization by CMP is performed to form an interlayer connection plug (FIG. 2(*d*)).

The present invention will be described specifically referring to examples; however, the present invention is not limited to these examples. The examples of the first stripping composition are shown in Examples 1, 3 and 4; and the examples of the second stripping composition are shown in Examples 2 and 5 to 9. Unless otherwise specified, percentage is based on weight.

EXAMPLE 1

The first stripping composition according to the present invention was applied to the process for forming a via hole on a copper wiring, and strippability and anticorrosive property were evaluated.

Samples for evaluation were made according to the process shown in FIG. 1(*a*) to FIG. 2(*c*). First, a copper wiring was formed on a silicon wafer, and then, a silicon nitride film of a thickness of 90 nm, a low-dielectric film of a thickness of 450 nm, and a silicon oxide film of a thickness of 450 nm were formed on the copper wiring. All of these films were formed using the plasma CVD method. Next, a positive-type resist was spin-coated to form a resist film. As the material of the resist film, a positive resist material for KrF, "PEX4" (Tokyo Ohka Kogyo Co., Ltd.) was used. This resist film was exposed through a mask pattern, and developed using an aqueous solution of tetramethyl ammonium hydroxide to obtain a resist pattern.

Using this resist film as a mask, the silicon oxide film and the low-dielectric film were subjected to dry etching until the silicon nitride film was exposed to form a via hole of an opening diameter of 0.2 μm. As the etching gas, a fluorocarbon-based gas was used. After the completion of etching, a part of the resist film was removed using oxygen plasma ashing, and then, stripping treatment was performed using the stripping composition shown in Table 1.

Next, the etching gas was changed, and the silicon nitride film was subjected to etching to expose the copper wiring on the bottom of the via hole. In order to remove the etching residues produced by this etching, stripping treatment was performed using the above-described stripping composition at room temperature (23° C.) for 10 minutes.

The same treatment was performed using stripping compositions No. 2 to No. 11 in Table 1, and total of 11 samples were prepared.

The wafers treated as described above were rinsed with pure water, and the cross sections of the samples were observed using an SEM (scanning electron microscope) to evaluate (1) stripping of resist films and etching residues on the via bottom, (2) the anticorrosive ability to the copper film exposed on the via bottom, and (3) damage of the surface of exposed low-dielectric film (SiOC). The criteria of evaluation were as follows:

(Strippability)

Residual conditions of the resist film and etching residue are observed on the via bottom, and evaluated by the following four scales:

A: No residue was observed.

B: Little residues were observed.

C: A small quantity of residues was observed.

D: A large quantity of residues was observed.

(Corrosion Resistance)

The corrosion of the surface of the copper film exposed on the via bottom was observed, and evaluated by the following four scales:

A: No corrosion of the copper film was observed.

B: Little corrosion of the copper film was observed.

C: A small quantity of corrosion of the copper film was observed.

D: A large quantity of corrosion of the copper film was observed.

(Damage of Low-dielectric Film)

The state of the surface of the low-dielectric film when SiOC-based films were used as the low-dielectric films was observed, and evaluated by the following four scales:

A: No damage was observed.

B: Little damage was observed.

C: Damage was observed.

D: Damage was significant.

TABLE 1

| Stripping agent No. | Composition (wt %) | | | | | | pH | Cu | | |
|---|---|---|---|---|---|---|---|---|---|---|
| | a) THFA | a) DEGB | b) Adenine | d) Water | e) 2MAE | c) Lactic acid | | Strippability; Via bottom | corrosion resistance | Film damage; SiOC-based |
| 1 | 43.0 | | 0.030 | 18.5 | 25.0 | 13.5 | 10.0 | A | C | B |
| 2 | 67.0 | | 0.030 | 19.0 | 6.0 | 8.0 | 8.6 | A | A | A |
| 3 | 75.0 | | 0.030 | 19.0 | 6.0 | 0.0 | 11.0 | C | C | B |
| 4 | 71.0 | | 0.030 | 19.0 | 6.0 | 4.0 | 10.0 | B | B | B |
| 5 | 90.0 | | 0.030 | 4.0 | 4.0 | 1.0 | 10.3 | C | A | A |
| 6 | 33.0 | | 0.030 | 60.0 | 3.0 | 4.0 | 6.6 | B | B | B |
| 7 | 23.0 | | 0.030 | 70.0 | 3.0 | 4.0 | 6.2 | C | C | B |
| 8 | 67.0 | | 0.001 | 19.0 | 6.0 | 8.0 | 8.6 | A | C | A |
| 9 | 67.0 | | 1.000 | 18.0 | 6.0 | 8.0 | 8.5 | A | A | A |
| 10 | | 65.0 | 0.030 | 20.5 | 10.0 | 4.5 | 10.0 | A | A | C |
| 11 | | 75.5 | 0.030 | 10.5 | 10.0 | 4.0 | 10.0 | A | A | C |

THFA: Tetrahydrofurfuryl alcohol
DEGB: Diethylene glycol monobutyl ether
2MAE: 2-Methylaminoethanol As described above, when alkanolamine and lactic acid are added, pH is controlled to neutral (pH 7) to weakly basic (pH 10), and water content is adjusted to less than 70%, corrosion resistance can be obtained even if an extremely low concentration of the anticorrosive is added. According to the stripping composition of the present invention, although a sufficient anticorrosive ability to Cu can be obtained when the content of the anticorrosive is 0.01% or more, more stable performance can be achieved if the content is 0.03% or more. That is, 0.01% or more anticorrosive can be added within a range where it can be dissolved. However, if the anticorrosive is excessively added, foreign matter may be produced after stripping treatment on the surface of the wafer. Since the anticorrosive is more expensive than other components, it is desired to limit the quantity to a necessary and sufficient quantity. According to embodiments of Japanese Patent Application Laid-Open Nos. 2000-162788 and 2001-83712, the content of benzotriazole and the derivatives thereof as the anticorrocive for Cu is 0.1 to 1% by weight, and the content of the anticorrosive in the stripping composition of the present invention is significantly lower than this. The stripping composition of the present invention exerts a high anticorrosive ability even in a low content, and exhibits a good performance to lower the damage of low-dielectric films, which is another object of the present invention. Furthermore, with regard to water content, it is preferably 2% or more and when the water content is 5% or more, it is also excellent in strippability, particularly in strippability at via bottom, which is the essential function of the stripping composition.

EXAMPLE 2

In the same manner as Example 1, a sample wherein an SiOC-based low-dielectric film having a copper wiring exposed on the bottom of the via hole was prepared. The sample was immersed in stripping compositions of Nos. 12 and 13 in Table 2 at room temperature (23° C.) for 10 minutes; thereafter the sample was directly rinsed with pure water, and evaluated in the same manner as in Example 1. Furthermore, unlike Example 1, continuous deposits of silicon oxide were observed on the surface of the sample before stripping treatment, and the removal of these deposits was also evaluated. For reference, the results obtained using the stripping composition of No. 2 used in Example 1 are also listed in Table 2.

TABLE 2

| Stripping agent No. | Composition (wt %) | | | | | | | Strippability | | Cu | |
|---|---|---|---|---|---|---|---|---|---|---|---|
| | a) THFA | b) Adenine | d) Water | e) 2MAE | c) Lactic acid | HF | pH | Via bottom | Surface oxide | corrosion resistance | Film damage; SiOC-based |
| 12 | 91.0 | 0.030 | 4.0 | 4.0 | | 1.0 | 7.6 | C | A | B | B |
| 13 | 87.0 | 0.030 | 4.0 | 4.0 | | 5.0 | 3.0 | C | A | C | C |
| 2 | 67.0 | 0.030 | 19.0 | 6.0 | 8.0 | 0.0 | 8.6 | A | D | A | A |

As can be seen from Table 2, although the addition of fluorine components is essential for removing silicon oxide deposits on the surface of the device, if the quantity of added fluorine components is excessively large, SiOC-based films are damaged. By adjusting the quantity or the alkanolamine or HF to control pH to nearly neutral, a stripping composition that excels in the anticorrosive ability and the ability to remove silicon oxide deposits on the surface of the device even by the addition of an extremely low content of anticorrosive, and scarcely damages SiOC-based low-dielectric films, can be obtained.

EXAMPLE 3

In order to confirm the effect of the anticorrosives, the anticorrosives in a typical composition (No. 2) of the stripping composition of Example 1 were changed, and strippability, such as the removal of deposits and anticorrosive ability to Cu, was evaluated. Sufficient strippability can be achieved when a generally used anticorrosive such as BTA is used; however, since purine and adenine, which is a derivative of purine, are biological materials, and excel in biodegradability, they can be used safely, and the waste can be treated easily. Therefore, they excel in environment consciousness.

TABLE 3

| Stripping agent No. | Anticorrosive | (wt %) | pH | Strippability Via bottom | Cu corrosion resistance | Film damage; SiOC-based |
|---|---|---|---|---|---|---|
| 2 | Adenine | 0.03 | 8.6 | A | A | A |
| 14 | Purine | 0.03 | 8.6 | A | A | A |
| 15 | BTA | 0.03 | 8.6 | A | A | A |

Other components: THFA 67.0, water 19, 2MAE 6, Lactic acid 8 (wt %)

EXAMPLE 4

If the chemical action of a stripping composition works on the uppermost surface of a substrate and surface residues, the stripping composition can sufficiently remove the surface residues. However, if the stripping composition has characteristics to permeate into a low-dielectric film, the chemical action of a stripping composition reaches inside the film and damages the film. It is effective for inhibiting the permeability of the stripping composition to select solvents, which are main components of the stripping composition, having a low permeability to the low-dielectric film. Therefore, solvents were dropped on SiOC-based and HSQ-based low-dielectric films, and the permeability of the solvents to low-dielectric films was evaluated from change over time in the contact angles thereof (Since low-dielectric films are porous, the contact angles thereof lower when a solvent permeates into the films.). Table 4 shows the results. Also, solvents were dropped on the surface of an MSQ-based thin low-dielectric film so that the diameter of a droplet is 1 mm; and 30 seconds later, the contact angle of the droplet with the film was measured, and after allowing the droplet to stand for 5 minutes, the diameter of the deformed droplet was measured. Furthermore, the discoloration of the film in the vicinity of the droplet was evaluated. Table 5 shows the results.

TABLE 4

| | Low-Dielectric Film | |
|---|---|---|
| Solvent | SiOC film permeability | HSQ film permeability |
| THFA | ◯ | ◯ |
| DEGB | Δ | × |
| DMSO | Δ | Δ |
| NMP | × | × |

◯—No permeability
Δ—Apparent permeability
×—Significant permeability

TABLE 5

| Solvent | Contact angle (°) | Droplet diameter (mm) | Film color change |
|---|---|---|---|
| THFA | 12 | 1.0 | No |
| FFA | 15 | 1.0 | No |
| DMSO | 27 | 1.5 | Yes |
| NMP | 15 | 2.0 | Yes |

FFA: Furfuryl alcohol
DMSO: Dimethyl sulfoxide
NMP: N-Methyl-2-pyrrolidone

As described above, little permeability was observed in THFA to any of inorganic SiOC-based and organic HSQ-based low-dielectric films. Although both THFA and FFA have low contact angles to MSQ and good wettability, the droplets after left to stand did not deform. On the other hand, other solvents had the same or larger contact angles than THFA, and spread on the surface of the film after left to stand; and the discoloration of the film due to permeation into the film was observed.

Although it is considered that the damage of the low-dielectric film is caused by the permeation of the stripping composition into the film and the attack of the skeleton constituting the film, since THFA of FFA used as the main solvent of the stripping agent does not permeate into the film, and since they have good wettability, only deposits left on the film can be stripped efficiently without damaging the low-dielectric film.

EXAMPLE 5

The second stripping composition according to the present invention was applied to the process for forming a via hole on a copper wiring, and strippability and anticorrosive property were evaluated.

Samples for evaluation were made according to the process shown in FIG. 1(a) to FIG. 2(c). First, a copper wiring was formed on a silicon wafer, and then, a silicon nitride film of a thickness of 90 nm, a low-dielectric film of a thickness of 450 nm, and a silicon oxide film of a thickness of 450 nm were formed on the copper wiring. All of these films were formed using the plasma CVD method. Next, a positive-type resist was spin-coated to form a resist film. This resist film was exposed through a mask pattern, and developed using an aqueous solution of tetramethyl ammonium hydroxide to obtain a resist pattern.

Using this resist film as a mask, the silicon oxide film and the low-dielectric film were subjected to dry etching until the silicon nitride film was exposed to form a via hole of an opening diameter of 0.2 $\mu$m. As the etching gas, a fluorocarbon-based gas was used. After the completion of etching, a part of the resist film was removed using oxygen plasma ashing, and then, stripping treatment was performed using the stripping composition whereto 1% benzotriazole was added (No. 16) shown in Table 6.

Next, the etching gas was changed, and the silicon nitride film was subjected to etching to expose the copper wiring on the bottom of the via hole. In order to remove the etching residues produced by this etching, stripping treatment was performed using the above-described stripping composition whereto 1% benzotriazole was added used in the above-described stripping treatment at a temperature of 80° C. for 10 minutes.

The same treatment was performed using stripping compositions (to any of which was added 1% benzotriazole) No. 17 to No. 20 in Table 6, and total of 5 samples were prepared.

The wafers treated as described above were immersed in iso-propyl alcohol (IPA) and rinsed with pure water, and the cross sections of the samples were observed using an SEM (scanning electron microscope) to evaluate (1) strippability of resist films and etching residues on the via bottom and the device oxide surface, (2) the anticorrosive ability to the copper film exposed on the via bottom, and (3) damage of the surface of exposed low-dielectric films (HSQ and MSQ). The criteria of evaluation were as follows:

(Strippability)

Residual conditions of the resist film and etching residue are observed on the via bottom and the surface of the device oxide film, and evaluated by the following four scales:

A: No residue was observed.
B: Little residues were observed.
C: A small quantity of residues was observed.
D: A large quantity of residues was observed.

(Corrosion Resistance)

The corrosion of the surface of the copper film exposed on the via bottom was observed, and evaluated by the following four scales:

A: No corrosion of the copper film was observed.
B: Little corrosion of the copper film was observed.
C: A small quantity of corrosion of the copper film was observed.
D: A large quantity of corrosion of the copper film was observed.

(Damage of Low-dielectric Film)

The state of the surface of the low-dielectric film when HSQ or MSQ were used as the low-dielectric film was observed, and evaluated by the following four scales:

A: No damage was observed.
B: Little damage was observed.
C: Damage was observed.
D: Damage was significant.

2MAE: 2-(methylamino) ethanol
BTA: benzotriazole
(-): result of observation not available As described above, it is known that the stripping compositions (Nos. 16 to 18) have excellent strippability and anticorrosive ability to Cu, little damage low-dielectric films, and the stripping compositions (No. 16 or 17) containing THFA or FFA, which is an alcohol having a cyclic ether structure are especially preferable. Although the present invention is applied to a single Damascene process in this Example, the present invention can also be applied to the process known as a dual Damascene process.

EXAMPLE 6

In the same process as in Example 5, using samples having copper wirings exposed on the bottom of via holes, evaluation was conducted by changing the content of THFA and alkanolamine. The samples were immersed in stripping compositions whereto 1% of benzotriazol was added, Nos. 21 to 23 in Table 7, at 80° C. for 10 minutes to make three types of samples. The samples were observed using the same evaluation method and criteria as in Example 5.

TABLE 6

| Stripping agent No. | Composition (wt %) | | | | | | Strippability | | Cu corrosion resistance | Film damage | |
|---|---|---|---|---|---|---|---|---|---|---|---|
| | (a) Component | (b) | BTA | (c') Component | (d) Water content | (e) 2MAE | pH | Via bottom | Surface oxide | | HSQ | MSQ |
| 16 | THFA (69) | | 1 | NH$_4$F(1) | 10 | 20 | 10.2 | B | B | B | B | A |
| 17 | FFA (69) | | 1 | NH$_4$F(1) | 10 | 20 | 9.8 | B | B | B | B | A |
| 18 | BE (69) | | 1 | NH$_4$F(1) | 10 | 20 | 10.1 | C | B | B | C | — |
| 19 | | NMP(69) | 1 | NH$_4$F(1) | 10 | 20 | 10.2 | B | B | B | D | — |
| 20 | | DMAC(69) | 1 | NH$_4$F(1) | 10 | 20 | 10.1 | D | — | D | D | — |

In Table 6, abbreviations and the symbol denote as follows:

TABLE 7

| Stripping agent No. | Composition (wt %) | | | | | | Strippability | | Cu corrosion resistance | Film damage | |
|---|---|---|---|---|---|---|---|---|---|---|---|
| | (a) THFA | (c') Component | (d) Water content | (e) 2MAE | pH | Via bottom | Surface oxide | | HSQ | MSQ |
| 21 | 89 | HF(0.5) | 9.5 | 0 | 2.0 | C | D | B | C | D |
| 22 | 79 | HF(0.5) | 9.5 | 10 | 9.2 | B | B | B | B | B |
| 23 | 19 | HF(0.5) | 9.5 | 70 | 13 | C | D | B | C | B |

THFA: tetrahydrofurfuryl alcohol
FFA: furfuryl alcohol
BE: butoxyethanol
NMP: N-methyl-2-pyrrolidone
DMAC: dimethylacetamide As described above, it is understood that the addition of an alkanolamine as the component (e), damage to the low-dielectric film can be minimized; however, if the quantity of the component (a) decreased due to excessive use of the alkanolamine (No. 23), the strippability tends to lower.

EXAMPLE 7

Evaluation was similarly conducted by changing the composition (mainly water content) and treatment temperature of the samples in Examples 5 and 6 as shown in Table 8, and using the stripping agent whereto 1% adenine was added as an anticorrosive component.

residues were produced on the via bottom at a low temperature (23° C.). At a low temperature, by the use of adenine or o-phthalic acid as the main component, or the mixture of these, or each of these whereto quinaldinic acid is added, excellent anticorrosive ability and residue removing ability can be made compatible.

TABLE 8

| Stripping agent No. | Composition (wt %) | | | | | Treating temperature (° C.) | Strippability | | Cu corrosion resistance | Film damage | |
|---|---|---|---|---|---|---|---|---|---|---|---|
| | (a) THFA | (c') Component | (d) Water content | (e) 2MAE | pH | | Via bottom | Surface oxide | | HSQ | MSQ |
| 24 | 77 | HF(1) | 1 | 20 | 10.7 | 80 | B | B | B | B | D |
| 25 | 68 | HF(1) | 10 | 20 | 10.5 | 80 | B | B | B | B | B |
| 26 | 55 | HF(4) | 20 | 20 | 9.4 | 23 | B | B | B | B | B |
| 27 | 43 | HF(1) | 35 | 20 | 10.6 | 80 | B | B | B | D | D |

As described above, it was found that the water content (moisture content) of the component (d) had an optimal range, and when conducting further investigation, it was confirmed that the range between 5% and 30% by weight was preferable.

EXAMPLE 8

When the treatment temperature was 80° C., the stripping treatment was performed using the stripping composition prepared by adding 1% by weight of the anticorrosive component listed in Table 9 to the composition containing 68% by weight of THFA, 1% by weight of HF, and 20% by weight of 2MAE, and adding water to make 100% by weight. When the treatment temperature was 23° C., the stripping treatment was performed using the stripping composition prepared by adding 1% by weight of the anticorrosive component listed in Table 9 to the composition containing 55% by weight of THFA, 4% by weight of HF, and 20% by weight of 2MAE, and adding water to make 100% by weight. When the mixture of two components was used as the anticorrosive component, they were mixed so that the ratio of component of the upper column to the component of the lower column became 9:1. In the same manner as in Example 5, (1) strippability at the via bottom, and (2) anticorrosive ability to Cu were evaluated. Table 9 shows the results.

TABLE 9

| Stripping agent No. | Anticorrosive component | Treating temperature (° C.) | Via bottom residue | Cu corrosion resistance |
|---|---|---|---|---|
| 28 | Benzotriazole | 80 | B | A |
| 29 | Benzotriazole | 23 | D | — |
| 30 | Tolyltriazole | 80 | B | A |
| 31 | Tolyltriazole | 23 | D | — |
| 32 | Adenine | 80 | B | A |
| 33 | Adenine | 23 | B | B |
| 34 | o-Phthalic acid | 23 | B | B |
| 35 | Benzoic acid | 23 | B | D |
| 36 | Quinaldic acid | 23 | C | C |
| 37 | Adenine + quinaldic acid | 23 | B | A |
| 38 | o-Phthalic acid + adenine | 23 | B | A |
| 39 | o-Phthalic acid + quinaldic acid | 23 | B | A |

As descried above, benzotriazole-based anticorrosive can be used at a high temperature (80° C.) without any problem,

EXAMPLE 9

Ammonium fluoride was added to 2MAE so that the fluorine content becomes 2.5%, and the mixed solution was treated under the conditions of Table 10. Furthermore, 1% by weight of bonzotriazole, 69% by weight of THFA, and the balance of water were added so that the mixed solution occupies 20% by weight of the total, to prepare a stripping composition. This composition was used to treat the slices of a wafer having an HSQ film formed on the entire surface thereof at 80° C. for 10 minutes to make three types of samples.

The thickness of these samples was measured with an ellipsometer to obtain the etch rate. Also using FT-IR measuring equipment, IR spectra of SiH and SiO in the HSQ film were measured, and the value obtained by dividing the SiH-derived peak intensity by the SiO-derived peak intensity to make the variation of the SiH film quality. Table 10 shows the results. For reference (ref), a stripping composition whereto HF was added so as to have the same fluorine content was prepared, and in the same manner, the etch rate and the variation of film quality were evaluated.

TABLE 10

| Stripping agent No. | Treating condition | HSQ film | |
|---|---|---|---|
| | | Etch rate (Å/min) | SiH/SiO peak intensity ratio |
| 40 | Without heating, used after preparing | 11.8 | 0.001 |
| 41 | Heated at 50° C. for 3 hours | 5.7 | 0.180 |
| 42 | Allowed to stand at room temperature for 1 week | 3.8 | 0.195 |
| ref | | 3.6 | 0.201 |

As described above, it is known that the etch rate can be reduced and the damage to film quality of HSQ can be inhibited by removing ammonium ions from the system by heating or allowing the solution to stand for a long period of time after mixing ammonium fluoride with alkanolamine. According to this Example, since dangerous hydrofluoric acid can be substituted by ammonium fluoride to achieve the same effect as hydrofluoric acid, workability is significantly improved.

What is claimed is:

1. A stripping composition comprising at least one of alcohols having a cyclic ether structure in the molecule thereof as component (a), an anticorrosive as component (b) and lactic acid as component (c).

2. The stripping composition according to claim 1, wherein said alcohol having a cyclic ether structure in the molecule thereof is represented by the following chemical formula:

X—(A—OH)$_n$ (where X is a cyclic ether structure, A is a hydrocarbon chain having 1 to 8 carbon atoms, and n is an integer of 1 or more and represents the number of substituents to the cyclic ether structure).

3. The stripping composition according to claim 1, wherein said alcohol having a cyclic ether structure in the molecule thereof is furfuryl alcohol or tetrahydrofurfuryl alcohol.

4. The stripping composition according to claim 1, wherein the component (a) is a mixture of alcohol having a cyclic ether structure in the molecule thereof and alcohol having a glycol ether structure in the molecule thereof.

5. The stripping composition according to claim 1, comprising water as component (d).

6. The stripping composition according to claim 5, wherein the content of said water is less than 70% by weight.

7. The stripping composition according to claim 1, wherein said component (b) is an anticorrosive selected fromthe grop consisting of (1) purine derivatives; (2) compounds of dibasicity of higher, each having at least one carboxylic group, having an ability to form a chelate with a metal, and having a hydrophobic group; (3) the mixture of said purine derivatives and quinaldinic acid, or (4) the mixture of said compounds of (2) and quinaldinic acid; (5) the mixture of said purine derivatives of (1) and said compounds of (2); and (6) the mixture of said purine derivatives of (1), said compounds of (2), and quinaldinic acid.

8. The stripping composition according to claim 7, wherein said compound of (2) is o-phthalic acid.

9. A stripping composition comprising at least one of alcohols having an ether-bond in the molecule thereof as component (a), and an anticorrosive as component (b), wherein said component (b) is an anticorrosive selected from the group consisting of (1) adenine or the derivative thereof; (2) compounds of dibasicity of higher each having at least one carboxylic group, having an ability to form a chelate with a metal, and having a hydrophobic group; (3) the mixture of said purine derivatives and quinaldinic acid, or (4) the mixture of said compounds of (2) and quinaldinic acid; (5) the mixture of said purine derivatives of (1) and said compounds of (2); and (6) the mixture of said purine derivatives of (1), said compounds of (2), and quinaldinic acid.

10. The stripping composition according to claim 1, further comprising at least one of amines as component (e).

11. The stripping composition according to claim 10, wherein said amine is an alkanolamine.

12. The stripping composition according to claim 10, wherein the base equivalent value of said amines is larger than the equivalent value of the acid component in the system.

13. The stripping composition according to claim 9, further comprising at least one of amines as component (e).

14. The stnpping composition according to claim 13, wherein said amine is an alkanolamine.

15. The stripping composition according to claim 13, wherein the base equivalent value of said amines is larger than the equivalent value of the acid component in the system.

16. The stripping composition according to claim 5, further comprising at least one of amines as component (e).

17. The stripping composition according to claim 16, wherein said amine is an alkanolamine.

18. The stripping composition according to claim 16, wherein the base equivalent value of said amines is larger than the equivalent value of the acid component in the system.

19. The stripping composition according to claim 16, comprising 0.001 to 15% by weight of component (b), 1 to 13.5% by weight of component (c), 2 to 70% by weight of component (d), 1 to 40% by weight of component (e), and 30% by weight or more component (a) as the balance.

20. A stripping composition comprising at least one of alcohols having an ether bond in the molecule thereof as component (a), at least one of hydrofluoric acid and a salt thereof as component (c'), and water as component (d).

21. The stripping composition according to claim 20, wherein said component (a) is an alcohol having a cyclic ether structure in the molecule thereof.

22. The stripping composition according to claim 21, wherein said alcohol having a cyclic ether structure in the molecule thereof is furfuryl alcohol or tetrahydrofurfuryl alcohol.

23. The stripping composition according to claim 20, further comprising at least one of amines as component (e).

24. The stripping composition according to claim 23, wherein said amine is an alkanolamine.

25. The stripping composition according to claim 23, comprising 0.01 to 15% by weight of component (c'), 5 to 30% by weight of component (d), 10 to 40% by weight of component (e), and 20% by weight or more component (a) as the balance.

26. The stripping composition according to claim 23, further comprising an anticorrosive as component (b).

27. The stripping composition according to claim 26, wherein said component (b) is an anticorrosive selected from the group consisting of (1) purine derivatives; (2) compounds of dibasicity of higher, each having at least one carboxylic group, having an ability to form a chelate with a metal, and having a hydrophobic group; (3) the mixture of said purine derivatives and quinaldinic acid, or (4) the mixture of said compounds of (2) and quinaldinic acid; (5) the mixture of said purine derivatives of (1) and said compounds of (2); and (6) the mixture of said purine derivatives of (1), said compounds of (2), and quinaldinic acid.

28. The stripping composition according to claim 27, wherein said compound of (2) is o-phthalic acid.

29. The stripping composition according to claim 27, wherein said purine derivative of (1) is adenine or a derivative thereof.

30. The stripping composition according to claim 26, comprising 0.001 to 15% by weight of component (b).

31. The stripping composition according to claim 9, wherein said component (a) is an alcohol having a cyclic ether structure in the molecule thereof.

32. The stripping composition according to claim 31, wherein said alcohol having a cyclic ether structure in the molecule thereof is represented by the following chemical formula:

X—(A—OH)n (where X is a cyclic ether structure, A is a hydrocarbon chain having 1 to 8 carbon atoms, and n is an integer of 1 or more and represents the number of substituents to the cyclic ether structure).

33. The stripping composition according to claim 31, wherein said alcohol having a cyclic ether structure in the molecule thereof is furfuryl alcohol or tetrahydrofurfuryl alcohol.

34. The stripping composition according to claim 9, wherein the component (a) is a mixture of alcohol having a cyclic ether structure in the molecule thereof and alcohol having a glycol ether structure in the molecule thereof.

35. The stripping composition according to claim 9, comprising water as component (d).

36. The stripping composition according to claim 35, wherein the content of said water is less than 70% by weight.

37. The stripping composition according to claim 9, further comprising at least one of organic or inorganic weak acids as component (c).

38. The stripping composition according to claim 37, wherein said component (c) is lactic acid.

39. The stripping composition according to claim 37, comprising water as component (d).

40. The stripping composition according to claim 39, wherein the content of said water is less than 70% by weight.

41. The stripping composition according to claim 39, further comprising at least one of amines as component (e).

42. The stripping composition according to claim 41, wherein said amine is an alkanolamine.

43. The stripping composition according to claim 41, wherein the base equivalent value of said amines is larger than the equivalent value of the acid component in the system.

44. The stripping composition according to claim 41, comprising 0.001 to 15% by weight of component (b), 0 to 15% by weight of component (c), 2 to 70% by weight of component (d), 1 to 40% by weight of component (e), and 30% by weight or more of component (a) as the balance.

* * * * *